United States Patent [19]

Büchl

[11] Patent Number: 4,823,825
[45] Date of Patent: Apr. 25, 1989

[54] METHOD OF OPERATING AN ELECTROMAGNETICALLY ACTUATED FUEL INTAKE OR EXHAUST VALVE OF AN INTERNAL COMBUSTION ENGINE

[76] Inventor: Josef Büchl, Rehsteig 12, D-8071 Lenting, Fed. Rep. of Germany

[21] Appl. No.: 135,700

[22] Filed: Dec. 21, 1987

Related U.S. Application Data

[63] Continuation-in-part of Ser. No. 856,032, Apr. 25, 1986, abandoned.

[30] Foreign Application Priority Data

Apr. 25, 1985 [DE] Fed. Rep. of Germany ....... 3515042

[51] Int. Cl.$^4$ .......................... F16K 31/02; F01L 9/04
[52] U.S. Cl. ....................................... 137/1; 123/90.11; 251/129.09; 361/152; 361/170
[58] Field of Search ............................. 123/90.11, 490; 317/123, 157; 361/190, 152, 154, 170; 137/1; 251/129.09, 129.1

[56] References Cited

U.S. PATENT DOCUMENTS

| 3,946,285 | 3/1976 | Berry | 317/123 |
| 4,417,201 | 11/1983 | Reddy | 123/490 |
| 4,612,597 | 9/1986 | Hamren | 361/152 |
| 4,620,261 | 10/1986 | Thornton | 361/154 |

*Primary Examiner*—Andrew M. Dolinar
*Attorney, Agent, or Firm*—Karl Hormann

[57] ABSTRACT

A method of detecting movement of an electromagnetically actuated valve of the kind useful in internal combustion engines for controlling fuel intake or exhaust emission, by monitoring the increase in energizing current for detecting a brief drop in the rising current characteristic of the armature of the electromagnet engaging the stator. A signal generated in response to the detected current drop, or the absence thereof, may be used to control the further operation of the valve.

5 Claims, 3 Drawing Sheets

METHOD OF OPERATING AN ELECTROMAGNETICALLY ACTUATED FUEL INTAKE OR EXHAUST VALVE OF AN INTERNAL COMBUSTION ENGINE

BACKGROUND OF THE INVENTION

1. Reference to Related Applications

The present application is a continuation-in-part application of abandoned application Ser. No. 856,032 filed Apr. 25, 1986, and discloses subject matter generally related to that of U.S. Pat. No. 4,544,986 issued Oct. 1, 1985; application Ser. Nos. 189,018 filed May 2, 1988; 184,148 filed Apr. 21, 1988; 019,242 filed Mar. 2. 1987; and 124,490 filed Nov. 23, 1987.

2. Field of the Invention

The invention relates to controlling the operation of an electromagnet in general and, more particularly, to the control of an electromagnet or solenoid useful for driving a gas exchange valve of an internal combustion engine into one of its two terminal positions. "Terminal position" as herein used is intended to connote either the open or the closed position of the valve, and "gas exchange valve" connotes either a fuel intake valve or an exhaust valve.

Driving such a valve electromagnetically, rather than by means of cams, offers certain advantages, not the least of which is fuel economy. Lest there be a massive failure of engine performance, electromagnetically driven valves must operate reliably and with predictable precision.

3. Statement of the Prior Art

West German patent specification DE-A No. 30 24 109 discloses an internal combustion engine which instead of conventional cam-driven tappet valves comprises electromagnetically operated fuel intake and exhaust valves. When not in operation or at rest, each valve is maintained by spring bias in a position intermediate its terminal, i.e., open and closed positions. Electromagnets may at times drive and maintain the valve in one of these terminal positions by way of an armature pulled into engagement with the stator of the electromagnet corresponding to the terminal position. When the electromagnet is deenergized, the armature and the valve connected therewith are respectively propelled by the bias of the spring in the direction of the other electromagnet and terminal position, and by appropriately timing the energization of the other electromagnet the armature is attracted into engagement therewith, and the valve is accordingly moved into its other terminal position.

Initial movement of the valve from its rest position intermediate its opening and closing solenoids may be imparted by a starting or initiating mechanism which mechanically, hydraulically or electromagnetically moves the valve into the vicinity of an energized solenoid and thus loads or energizes the spring system to enable it subsequently to propel the valve between its open and closed positions.

Alternatively, by energizing one of the solenoid the armature may move the valve out of its rest position into its corresponding operative or terminal positions.

West German patent specification DE-OS No. 28 28 678 describes a method of operating an electromagnetic load of the kind here under consideration. It provides for driving an armature into engagement with a stator, and subsequently retaining the engagement. To maintain a favorable balance in the energy required for building up the magnetic flux, initial energization takes place at a current level sufficiently high to attract the armature into engagement with the stator, followed by reducing the current to a level sufficient for maintaining the engagement.

It would be highly desirable to have a positive indication of movement or no movement of the valve between its terminal positions, and to be able to introduce appropriate remedial action if in case of a malfunction the valve remains stationary in its intermediate rest position continuing alternating energization of the electromagnets intended to drive the valve between its open or closed positions notwithstanding.

OBJECTS OF THE INVENTION

It is an object of the invention to monitor the movement of an electromagnetically driven valve.

Another object of the invention resides in a method of establishing movement of an electromagnetically controlled valve into one of two terminal positions.

It is also an object of the invention to provide for positive identification of the movement of a gas exchange valve between its terminal positions and for moving the valve into a terminal position in the absence of such identification.

It is yet another object of the invention to monitor current flow in one of two electromagnets of a gas exchange valve during an interval commencing a predetermined time after the deenergization of the other electromagnet.

It is a further object of the invention to monitor the energization of an electromagnet for driving a gas exchange valve to detect engagement of its armature with its stator.

Another object of the invention resides in the provision of establishing contact of the armature of an electromagnet with its stator during an interval commencing at a predetermined time.

A further object of the invention resides in the provision of a method establishing contact between an armature of an electromagnet with its stator within a certain time span commencing with a predetermined event.

A further object of the invention resides in a method of moving an electromagnetically actuated fuel intake or exhaust valve into its intended terminal position in case of malfunction during an ordinary operating cycle.

Other objects of the invention will in part be obvious and will in part appear hereinafter. The invention accordingly comprises the steps exemplified in the detailed disclosure which follows.

SUMMARY OF THE INVENTION

In the accomplishment of these and other objects, the invention proposes a novel method of monitoring the energizing current of an electromagnet for driving a gas exchange valve, at least during a predetermined phase of its operation, for the purpose of detecting the engagement of its armature with the stator and, hence, the arrival of the valve in the terminal position corresponding to the electromagnet and of moving the valve into its terminal position when no such engagement is detected.

The invention, in a preferred embodiment thereof, provides for a method of monitoring the energization of an electromagnet within an interval commencing subsequent to a predetermined operative event, to detect a brief drop in current increase characteristic of an armature having engaged a stator.

Preferably, the interval during which monitoring for detecting whether a valve has arrived in one of its two terminal positions takes place commences a certain time following the deenergization of an electromagnetic maintaining the valve in the other of said two terminal positions.

BRIEF DESCRIPTION OF THE DRAWINGS

The novel features which are considered characteristic of the invention are set forth with particularity in the appended claims. The invention itself, however, particularly in its operating steps and associated apparatus, together with other objects and advantages thereof, will be best understood from the following description when read in connection with the accompanying drawings wherein like reference numerals have been employed in the different figures to denote identical parts and wherein:

DETAILED DESCRIPTION

Figure 1:
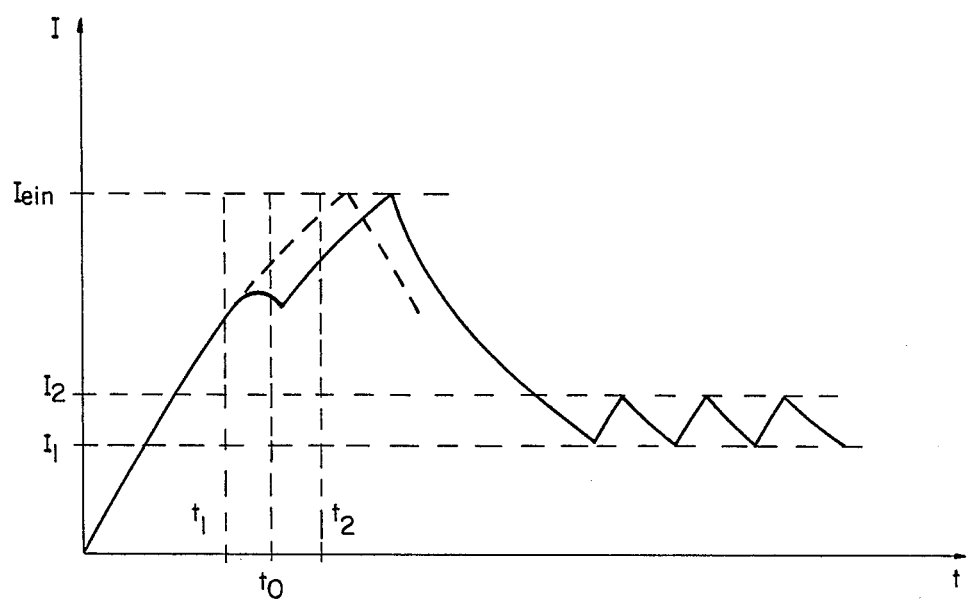
FIG. 1 is a diagram depicting the increase in energizing current of an electromagnet including the temporary drop in current characteristic of the engagement of the armature with the stator.
Figure 5:
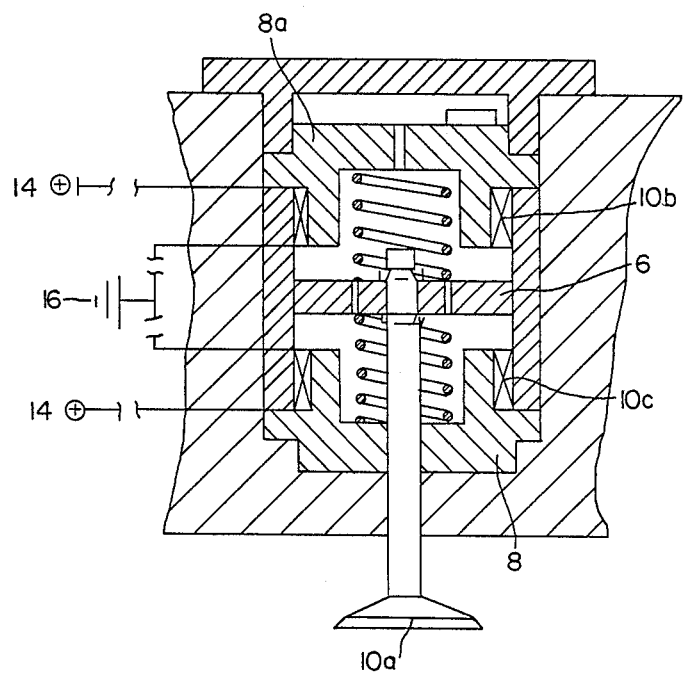
FIG. 5 depicts an embodiment of the invention including a valve having a dual coil electromagnet.

FIG. 1 depicts a curve which is typical of the flow of current required for energizing an electromagnetic load. The slope of the curve is a function of the current and the inductance of the electromagnetic load. As will be described, the electromagnetic load may consist, for instance, of a solenoid comprising a coil 10 (FIG. 3), a stator 8: 8a, and an armature 6 as well as a switching element 18 (FIG. 3) for selectively connecting the coil 10 to a source 14 of current. The solenoid may be one of two such solenoids as shown at 10b and 10c in FIG. 5 connected with a fuel intake or exhaust valve 10a (FIG. 3) of an internal combustion engine (not shown) and may serve to drive and thereafter maintain the valve in one of its two terminal positions. The electromagnet 10 is initially energized by a high level current, followed by lower level current pulses. The high level current effectively pulls the armature into engagement with the stator and thus drives the valve 10a approaching under spring pressure from one of its terminal positions into its other terminal position. To maintain the engagement the reduced level current pulses suffice.

As shown in FIG. 1, at time $t=0$ current is switched on and increases asymptotically towards a maximum value at a predetermined slope. At the same time, the armature commences at time $t=0$ to move towards the stator. The mechanical structure of the apparatus is such that the time during which the armature is moving towards the stator may be predicted with sufficient accuracy to be reproducible. At time $t_0$ the armature engages the stator. The engagement is recognizable from the current flow pattern by a brief drop in current followed by a renewed increase to the maximum current value $I_{ein}$. The current drop is also of predetermined slope.

The broken line depicts the current flow pattern for the case where the armature fails to engage the stator. As shown, in that case the brief drop in current does not occur.

In accordance with the invention the current flow pattern is being monitored during an interval centered about time $t_0$, for instance during the interval from $t_1-t_2$. $t_1$ may be a predetermined instant in time following the deenergization of the other one of the two solenoids required to move the valve between its two terminal positions. If, during this interval, a drop in current of the predetermined slope is detected, an indication will have been obtained that the armature has in effect moved into engagement with the stator. Conversely, if no drop or a drop of a slope different from the predetermined one is detected, the armature may be assumed not to have moved into engagement with the stator.

Figure 2:
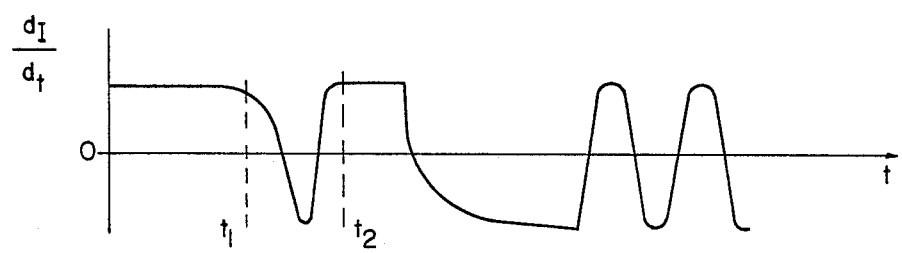
FIG. 2 is a diagram depicting the curve of FIG. 1 in integrated form.

Monitoring may be accomplished by differentiating the current flow. The signal thus obtained is depicted in FIG. 2. If during the interval $t_1-t_2$ the differentiated signal drops to a negative value, the armature will have engaged the stator and the current may thereafter be reduced to a level sufficient to maintain the engagement. In the absence of the negative signal the armature and its valve may be assumed not to have moved into engagement with the stator or into the terminal position, and the system may generate a signal for energizing either a separate start-up or initiating solenoid or the electromagnet 10 in such a manner that the armature is indeed pulled into engagement with the stator in the manner described above.

Figure 3:
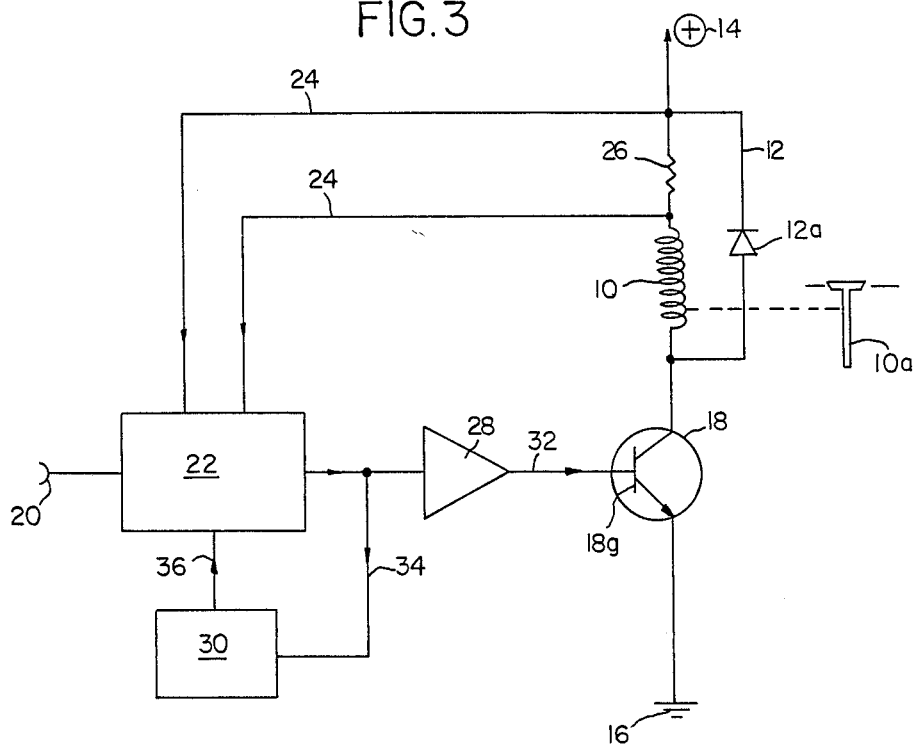
FIG. 3 is a diagram of a circuit useful for energizing an electromagnetic load in accordance with the invention.

A circuit of the kind useful in the practice of the invention is schematically shown in FIG. 3. An electromagnetic load depicted as a coil 10 of an electromagnet (not shown) is connected in a freewheeling circuit 12 arrangement including a diode 12a. The electromagnet may be one of a pair of electromagnets required for moving the valve between its two terminal positions. The electromagnet or solenoid 10 may be connected to a fuel intake or exhaust valve 10a as indicated by a broken line, for selectively driving it into one of its two terminal positions. Alternatively, the solenoid 10 may be of the kind which by appropriate controls may be driven bidirectionally for moving the valve into either of its two terminal positions.

The solenoid 10 and its freewheeling circuit 12 are connected between the positive terminal 14 of a current source and ground 16 by way of a switching element 18. The switching element is shown to be a transistor; but another switch such as a thyristor (SCR) or relay may be utilized instead. In an alternative arrangement, a thyristor (not shown) may be connected in parallel to the transistor 18. Such a thyristor may be utilized for the initial high current energization of the solenoid 10, and the transistor could be utilized initially to shunt the thyristor for turning it off and thereafter to feed lower level holding current pulses to the solenoid.

When during operation of the valve 10a the transistor 18 is rendered conductive by a signal at times applied to its gate 18g current will flow through the coil 10 of the solenoid to pull its armature (not shown) into engagement with its stator (also not shown) and thus drive the valve 10a into its terminal position corresponding to the solenoid. For purposes of the present description it will be assumed that the valve is of the kind initially biased by spring pressure into a rest position intermediate its open and closed positions. To start, or to be initiated from the rest position to one of its terminal positions, the valve may be provided with separate mechanical, hydraulic or electromagnetic starting or initiating units of the kind known in the art. For the sake of simplifying the instant description, however, the initiation of the valve will be carried out by the solenoid 10 which may be utilized for driving the valve initially, or in circumstances to be described, from its intermediate rest position into its terminal position.

The current increases in the manner shown in FIG. 1, and upon engagement of the armature with the stator, shown to occur between $t_1$ and $t_0$, there is a brief current drop of predetermined slope before the current again increase to its maximum value, $I_{ein}$. At this point the transistor 18 is switched off and freewheeling current decays until it has reached a level $I_1$. The transistor 18 may now be turned on intermittently to apply current pulses to the solenoid 10 to maintain the engagement between the armature and the stator. The level of these pulses is shown to be between $I_1$ and $I_2$.

The level of current including the drop occurring when the armature engages the stator are detected across a measuring resistor 26 and are monitored by a control unit 22 to be described. The control unit 22 is connected to the measuring resistor 26 by two leads 24a and 24b. Monitoring the current flow for purposes of detecting the current drop preferably occurs at predetermined interval $t_1-t_2$ to avoid confusion with other current drops as may occur at other times but not relating to the engagement of the armature with the stator. The interval of monitoring may be established upon empirical data based upon engine parameters and may commence, for example, the instant the other of the two solenoids controlling valve movement is deenergized.

If the drop in current has been detected, the control unit 22, following the decay of the freewheeling current to level $I_1$, will intermittently turn the transistor 18 on and off by feeding pulses to its gate 18g by way of a driver 28 and lead 32 or, in the absence of the current drop during the interval $t_1-t_2$, the control unit 22 will generate a signal which either causes the separate start-up means (not shown) or the solenoid 10 to drive the valve 10a into its terminal position.

The control unit 22 is seen to have another input 20 for receiving external signals, for instance, from a processor or calculator 50 (FIG. 4) which forms no part of the present invention but which may release signals for operating the circuit of FIG. 3 on the basis of engine parameters. Furthermore, the output 32 of the control unit 22 has a branch line 34 connected to an input of a frequency measuring unit 30 an output 36 of which is connected to the control unit 22. The frequency measuring unit 30 forms no part of the present invention; it serves to compare the frequency of operating cycles, i.e. energization and current decay, of the solenoid 10 with a predetermined frequency.

Figure 4:
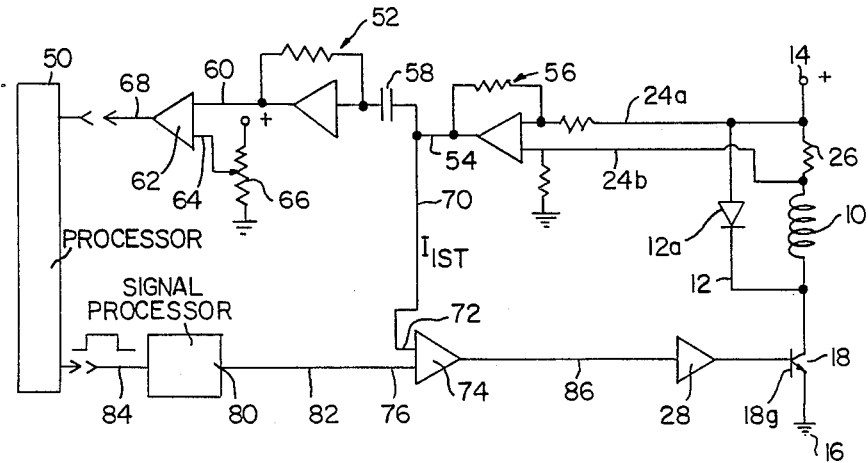
FIG. 4 is a diagram of a circuit capable of monitoring the position of the armature of an electromagnetic valve during at least a portion of its operational cycle.

FIG. 4 is a circuit diagram explaining the function of the control unit 22 in the context of the present invention. It comprises a differential amplifier 52. A signal representative of a voltage drop across the resistor 26 is fed to the amplifier 52 along line 54 after amplification by a further amplifier 56 the input terminals of which are connected to the resistor 26 by the leads 24a and 24b. The amplifier 52 reacts to changes in current only by virtue of a capacitor 58 connected to the input of the amplifier 52. When a time $t_0$, during the interval between $t_1$ and $t_2$ (FIG. 1) a current drop occurs, the amplifier 52 feeds it to one input 60 of a comparator 62. The other input 64 of the comparator 62 is connected to a threshold or reference signal generator 66 shown as a variable resistor. An output terminal 68 of the comparator 62 is connected to the processor 50.

The output line 54 of the amplifier 56 has a branch line 70 which leads to one input 72 of a comparator 74. Another input terminal 76 of the comparator 74 is connected to an output terminal 78 of a signal processor 80 by a line 82. The input terminal 84 of the signal processor 80 is connected to an output of the processor 50.

The output terminal of the comparator 74 is connected, by line 86, to the input of the driver 28 the output of which is in turn connected to the gate 18g of the tranistor 18 by way of line 32.

If the current drop detected during the interval $t_1-t_2$ is of predetermined magnitude and the signal amplified by amplifiers 56 and 52 is fed to input 60 of the comparator 62 exceeds a predetermined value, the signal is fed to the processor 50 for further processing by the signal processor 80. The processed signal is then applied by way of a line 82, the comparator 74, line 86, driver 28 and line 32 to the gate 18g of the transistor 18 for rendering the transistor 18 conductive for intermittently energizing the freewheeling circuit 12 with current pulses between levels $I_1$ and $I_2$ (FIG. 1).

On the other hand, if the current drop detected is less than the predetermined magnitude, a signal will be fed to the gate 18g by way of lines 54 and 70, comparator 74, line 86 driver 28 and line 32 to render the transistor 18 conductive for the purpose of initiating the valve 10a in the manner aforesaid.

It is believed that the invention described, and the advantages to be derived therefrom, indicate that the objects stated above have been attained.

What is claimed is:

1. A method of monitoring an operational cycle of a valve actuated by electromagnetic means including a first electromagnet for moving and maintaining said valve in one of two terminal positions and a second electromagnet for moving and maintaining said valve in a second of said two terminal positions, said cycle comprising a first phase of moving said valve into one of its first and second terminal positions by energizing one of said first and second electromagnets with current increasing to a first level and a second phase of maintaining said valve in said one of said first and second terminal positions by current reduced to a lower level, said first and second electromagnets being alternatingly energized and deenergized, comprising the steps of:

monitoring said current increase in said one of said first and second electromagnets during an interval commencing a predetermined time after the deenergization of the other of said first and second electromagnets to detect a temporary drop in the energizing current characteristic of said valve having moved into one of its said first and second terminal positions;

generating a signal in the absence of said current drop; and moving said valve to said one of said first and second terminal positions in response to said signal.

2. The method of claim 1, wherein said first level current increase and said current drop are of predetermined slope.

3. The method of claim 2, further comprising the step of differentiating said slope for generating at least said first signal.

4. The method of claim 3, wherein said valve comprises initiating means, further comprising the step of applying said signal to said initiating means for driving said valve into said one of said first and second terminal positions.

5. The method of claim 4, wherein said initiating means comprises said electromagnetic means.

* * * * *